(12) United States Patent
    Qin

(10) Patent No.: US 11,333,296 B2
(45) Date of Patent: May 17, 2022

(54) DISPLAY PANEL FRAME

(71) Applicant: WUHAN CHINA STAR OPTOELECTRONICS SEMICONDUCTOR DISPLAY TECHNOLOGY CO., LTD., Hubei (CN)

(72) Inventor: Xuesi Qin, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 364 days.

(21) Appl. No.: 16/478,279

(22) PCT Filed: Jan. 2, 2019

(86) PCT No.: PCT/CN2019/070115
    § 371 (c)(1),
    (2) Date: Jul. 16, 2019

(87) PCT Pub. No.: WO2020/098131
    PCT Pub. Date: May 22, 2020

(65) Prior Publication Data
    US 2021/0332939 A1    Oct. 28, 2021

(30) Foreign Application Priority Data

Nov. 15, 2018    (CN) .......................... 201811360205.5

(51) Int. Cl.
    *G09F 9/30*      (2006.01)
    *F16M 11/22*     (2006.01)
(52) U.S. Cl.
    CPC ............. *F16M 11/22* (2013.01); *G09F 9/301* (2013.01)
(58) Field of Classification Search
    USPC ............ 361/679.21; 348/787, 788, 789, 794, 348/825, 828, 836, 844
    See application file for complete search history.

(56) References Cited

U.S. PATENT DOCUMENTS

2004/0183958 A1*  9/2004  Akiyama .................. G09F 9/30
                                                      349/58
2014/0118910 A1*  5/2014  Sung ....................... G09F 9/301
                                                      361/679.01
2020/0323087 A1* 10/2020  Hwang ................ H05K 5/0017

* cited by examiner

Primary Examiner — Alfred J Wujciak

(57) ABSTRACT

A display panel frame is provided. The frame includes a substrate having a bendable portion and two connecting portions connected to two sides of the bendable portion; and a connecting structure including two connecting members and an elastic belt. The two connecting members are respectively mounted to the two connecting portions and disposed opposite to each other, and the elastic belt is sleeved on the two connecting members and wound around outer surfaces of the two connecting members. Thus, the structural design of the product can be simplified to ensure that it does not cause product failure after bending over a long period of time, and increase the toughness of the flexible substrate, so that it is beneficial to ensure product reliability under long time bending.

6 Claims, 3 Drawing Sheets

DISPLAY PANEL FRAME

FIELD OF INVENTION

The present invention relates to a frame, and more particularly to a frame for a flexible display panel, and more particularly to a frame for a flexible display panel of a foldable smartphone.

BACKGROUND OF INVENTION

Nowadays, flexible organic light-emitting diode displays attract attention and are widely recognized as next generation of mainstream displays. However, organic light-emitting diode panels still have obvious defects, such as shorter service life than liquid crystal displays, which seriously affects the application of organic light-emitting diode panels.

TECHNICAL PROBLEM: However, the flexible organic light-emitting diode display panels in practical use of bendable frames still have the following problems, for example, the existing flexible organic light-emitting diode display panels are still limited to a static bending stage, and existing experimental frames for flexible organic light-emitting diode display panels mostly use a plurality of gears, hinges, and the like to achieve a flexible bending result. However, the above designs are still in an experimental stage, and mass production of frame products are still to be achieved, and frame structure designs are complicated, and cannot ensure that the display panels under long time bending will not cause product failure.

Therefore, it is necessary to provide a display panel frame to solve the problems of the conventional art.

SUMMARY OF INVENTION

In view of above, the present invention provides a display panel frame to solve the problem that the structural designs existing in the conventional art are complicated and cannot ensure that the display panels under long time bending will not cause product failure.

The main object of the present invention is to provide a display panel frame that can adapt to deformation caused by dynamic bending/dynamic expanding of a display panel, and ensures that bending over a long period of time does not cause product failure.

A secondary object of the present invention is to provide a display panel frame that can provide a relatively simple structural design, increase the tenacity of a flexible substrate, and facilitate the product reliability of the display panel under long time bending.

In order to achieve the foregoing objects of the present invention, an embodiment of the present invention provides a bendable display panel, including:

a bendable panel;

a frame having a panel disposing region, a bending region, a plurality of auxiliary ribs and a limiting frame, wherein the bendable panel is disposed in the panel disposing region, and the bending region is located in an intermediate position of the panel disposing region, the auxiliary ribs are disposed at two sides of the bending region for limiting a position of the bendable panel, and the limiting frame is disposed at at least two sides of the frame to fix the bendable panel, wherein the bending region has a polymer layer, a compressive property of a first side of the polymer layer that is close to the bendable panel is higher than a compressive property of a second side of the polymer layer that is away from the bendable panel, and a tensility of the first side of the polymer layer is higher than a tensility of the second side of the polymer layer; and a buffer member disposed below the frame.

In an embodiment of the invention, the frame further includes: at least one belt roller disposed in the limiting frame; at least one limiting roller disposed under the auxiliary ribs; and an elastic belt connected to the belt roller and the limiting roller.

In an embodiment of the invention, the polymer layer has a plurality of compressible particles, and a number of the compressible particles distributed in the first side of the polymer layer is more than a number of the compressible particles distributed in the second side of the polymer layer.

In an embodiment of the invention, the polymer layer has a first polymer layer and a second polymer layer; the first polymer layer is located at the first side of the polymer layer, and a plurality of first elastic particles are added into the first polymer layer; and the second polymer layer is located at the second side of the polymer layer, and a plurality of second elastic particles are added into the second polymer layer, wherein a compressive property of the first elastic particles is higher than a compressive property of the second elastic particles, and a tensility of the second elastic particles is higher than a tensility of the first elastic particles.

Another embodiment of the present invention provides a frame, including:

a substrate including a bendable portion and two connecting portions connected to two sides of the bendable portion; and a connecting structure including two connecting members and an elastic belt, wherein the two connecting members are respectively mounted to the two connecting portions and disposed opposite to each other, and the elastic belt is sleeved on the two connecting members and wound around outer surfaces of the two connecting members.

In an embodiment of the invention, the elastic belt further includes two outer portions, and a first portion and a second portion that are connected between two ends of the two outer portions, and the two outer portions are connected to outer surfaces of the two connecting members.

In an embodiment of the invention, the first portion is parallel to the second portion.

In an embodiment of the invention, the two connecting members are respectively rotatably mounted to the two connecting portions.

In an embodiment of the invention, the connecting structure further includes a driving member coupled to the corresponding connecting member to drive the connecting member to rotate relative to the connecting portion.

In an embodiment of the invention, the connecting structure further includes at least one limiting roller set.

In an embodiment of the invention, the connecting structure further includes a first limiting roller set disposed at the bendable portion and a second limiting roller set disposed at the two connecting portions; and the substrate further includes a plurality of auxiliary ribs, wherein the second limiting roller set is disposed in the auxiliary ribs.

In an embodiment of the invention, a compressive property of a first side of the bendable portion that is close to an upper surface of the substrate is higher than a compressive property of a second side of the bendable portion that is away from the upper surface of the substrate, and a tensility of the second side of the bendable portion is higher than a tensility of the first side of the bendable portion.

In an embodiment of the invention, the bendable portion has a first polymer layer and a second polymer layer; the first polymer layer is located at the first side of the bendable portion, and the second polymer layer is located at the second side of the bendable portion, and the first polymer layer is amorphous high density polyethylene, and the second polymer layer is polyethylene or ethylene-vinyl acetate copolymer.

Furthermore, yet another embodiment of the present invention provides a display, including:

a panel; and a frame including:

a substrate including a bendable portion and two connecting portions connected to two sides of the bendable portion; and a connecting structure including two connecting members and an elastic belt, wherein the two connecting members are respectively mounted to the two connecting portions and disposed opposite to each other, and the elastic belt is sleeved on the two connecting members and wound around outer surfaces of the two connecting members.

In an embodiment of the invention, the elastic belt further includes two outer portions, and a first portion and a second portion that are connected between one end and an end of the two outer portions, and the two outer portions are connected to outer surfaces of the two connecting members, and the first portion is parallel to the second portion.

In an embodiment of the invention, the two connecting members are respectively rotatably mounted to the two connecting portions, and wherein the connecting structure further includes a driving member coupled to the corresponding connecting member to drive the connecting member to rotate relative to the connecting portion.

In an embodiment of the invention, the connecting structure further includes at least one limiting roller set.

In an embodiment of the invention, the connecting structure further includes a first limiting roller set disposed at the bendable portion and a second limiting roller set disposed at the two connecting portions; and the substrate further includes a plurality of auxiliary ribs, wherein the second limiting roller set is disposed in the auxiliary ribs.

In an embodiment of the invention, a compressive property of a first side of the bendable portion that is close to an upper surface of the substrate is higher than a compressive property of a second side of the bendable portion that is away from the upper surface of the substrate, and a tensility of the second side of the bendable portion is higher than a tensility of the first side of the bendable portion.

In an embodiment of the invention, the bendable portion has a first polymer layer and a second polymer layer; the first polymer layer is located at the first side of the bendable portion, and the second polymer layer is located at the second side of the bendable portion, and the first polymer layer is amorphous high density polyethylene, and the second polymer layer is polyethylene or ethylene-vinyl acetate copolymer.

BENEFICIAL EFFECT: Compared with the conventional art, the display panel frame of the present invention not only simplifies the product structural design, but also make the display frame to adapt the deformation of the display panel caused by the dynamic bending/dynamic expending of the display panel, and ensures that that the display panels under long time bending will not cause product failure. The present invention can also increase the tenacity of the flexible substrate, and is facilitate to ensure the product reliability of the display panels under long time bending.

DRAWINGS

In order to make the above description of the present invention more comprehensible, the preferred embodiments are described below, and in conjunction with the accompanying drawings, the detailed description is as follows.

DETAILED DESCRIPTION OF EMBODIMENTS

Those skilled in the relevant art will understand that for simplicity and clarity, elements shown in the figures are not necessarily to scale. That is, in various embodiments, the selected elements are illustrated to enhance the understanding of the functions and the configurations. In commercially implemented case, generally easy to understand and may be useful or necessary components may not describe or illustrate in the schematic diagrams of the following embodiments. It should also be appreciated that certain actions and/or steps in the embodiments of the method described or depicted are not necessarily required to occur in a particular order, and such specific sequences are not necessarily required by those skilled in the art. It should also be understood that the vocabulary and terms used in the specification have a general meaning, unless there are other specific meanings described in this document, otherwise these vocabulary and terms are the meaning of investigation and research in their respective fields.

In order to make the objects, technical solutions and advantages of the embodiments of the present invention more clear, the technical solutions of the embodiments of the present invention will be clearly and completely described in conjunction with the accompanying drawings of the embodiments of the present invention. It is apparent that the described embodiments are part of the embodiments of the invention, and not all of the embodiments. All other embodiments obtained by those of ordinary skill in the art based on the described embodiments of the invention are within the scope of the invention.

Unless otherwise defined, technical terms or scientific terms used herein shall be the general meaning as understood by those of skill in the art. The words "first", "second" and similar terms used in the specification and claims of the present invention do not denote any order, quantity, or importance, but are merely used to distinguish different components. Similarly, the words "a", "an", "the" and "said" and similar terms does not denote a quantity limitation, but rather indicates that there is at least one, including plural references, unless the context clearly dictates otherwise. For example, the term "a substrate" or "at least one substrate" may include a plurality of substrates, including compositions thereof.

Furthermore, the directional terms mentioned in the present invention, such as upper, lower, top, bottom, front, rear, left, right, inner, outer, side, surrounding, central, horizontal, lateral, vertical, longitudinal, axial, radial, uppermost or lowermost, etc., only refer to the direction of the accompanying drawing. Therefore, the directional terms used in the description is for the purpose of illustration and understanding of the invention, instead of limiting the invention.

Figure 1:
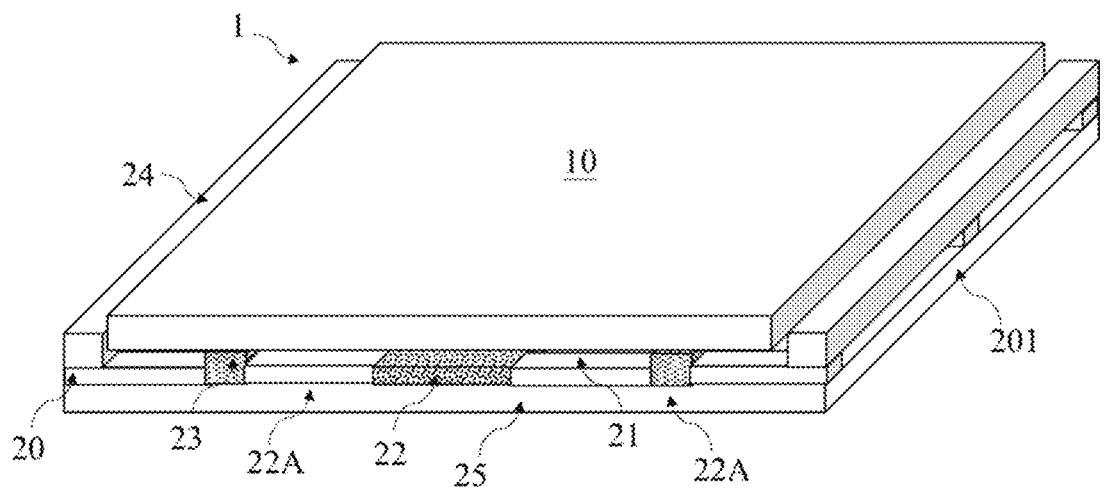
FIG. 1 is a schematic view of a display according to a first embodiment of the present invention.
Figure 2:
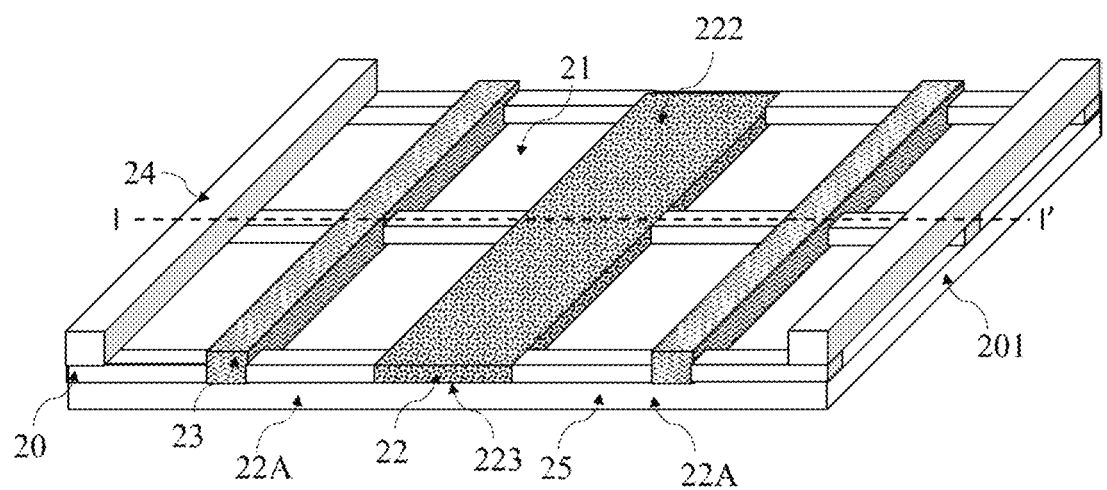
FIG. 2 is a schematic view of a frame according to the first embodiment of the present invention.

Please refer to FIG. 1 and FIG. 2, a display 1 according to a first embodiment of the present invention mainly includes a panel 10, a frame 20, and a buffer member 25. The frame 20 includes a substrate 201, and the substrate 201 includes a bendable portion 22 and two connecting portions 22A connected to two sides of the bendable portion 22. The frame 20 further has a panel disposing region 21, a plurality of auxiliary ribs 23, and a limiting frame 24. The panel 10 is disposed in the panel disposing region 21, the bendable portion 22 is located in an intermediate position of the panel disposing region 21, the plurality of auxiliary ribs 23 are disposed at the two sides of the bendable portion 22 for limiting a position of the panel 10, and the limiting frame 24 is disposed at at least two sides of the frame 20 to fix the panel 10. The bendable portion 22 has a polymer layer, a compressive property of a first side 222 of the bendable portion 22 that is close to an upper surface of the substrate 201 is higher than a compressive property of a second side 223 of the bendable portion 22 that is away from the upper surface of the substrate 201, and a tensility of the second side 223 of the bendable portion 22 is higher than a tensility of the first side 222 of the bendable portion 22. The buffer member 25 is disposed under the frame 20.

The detailed construction, assembly relationship, and operation principle of the above-described respective elements of the first embodiment will be described in detail below with reference to FIGS. 1 and 2.

Please refer to FIG. 1, as shown in the display 1 according to the first embodiment of the present invention, the panel 10 is adhered to a space defined by the panel disposing region 21 through an adhesive layer. In this embodiment, the bendable portion 22 is located at an intermediate position of the panel disposing region 21. Moreover, in other embodiments, the bendable portion 22 may be located at any position of the panel disposing region 21. The plurality of auxiliary ribs 23 protrude from a plane of the bendable portion 22 such that the plurality of auxiliary ribs 23 are in contact with the panel 10, and the limiting frame 24 has a lateral side that is in contact with a lateral side of the panel 10 thereby limiting a lateral movement of the panel 10. The plurality of auxiliary ribs 23 may be provided with a non-slip layer for limiting a position of the panel 10. In other embodiments, the plurality of auxiliary ribs 23 may be provided with an adhesive layer configured to directly adhere the panel 10 to the plurality of auxiliary ribs 23. The limiting frame 24 is disposed at at least two sides of the frame 20 that is configured to fix the panel 10.

Figure 3:
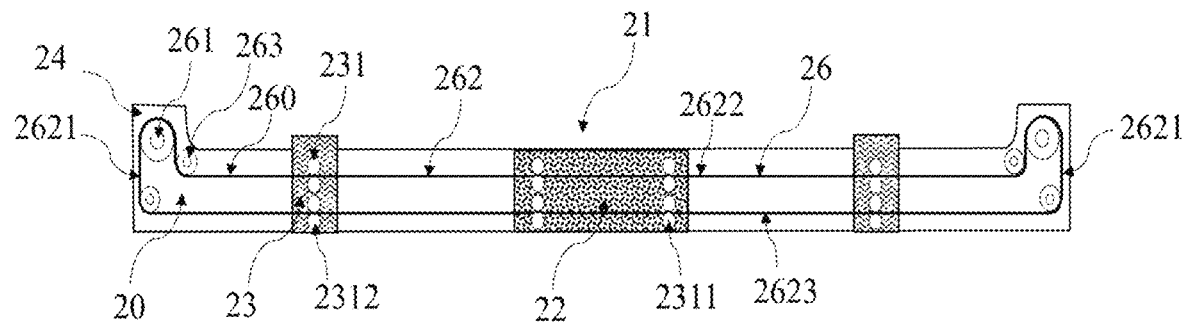
FIG. 3 is a cross-sectional view of the frame along the line I-I' according to the first embodiment of the present invention.

Next, please refer to FIG. 3. FIG. 3 is a cross-sectional view of the frame along the line I-I' according to the first embodiment of the present invention. The frame 20 includes a connecting structure 260 disposed therein, and the connecting structure 260 includes two rotatable connecting members 261 and an elastic belt 262. The two rotatable connecting members 261 are respectively mounted to the two connecting portions 22A and disposed opposite to each other. the elastic belt 262 is sleeved on the two rotatable connecting members 261 and wound around outer surfaces of the two rotatable connecting members 261. In this embodiment, the two rotatable connecting members 261 are belt rollers and disposed in the limiting frame 24. The elastic belt further includes two outer portions 2621, and a first portion 2622 and a second portion 2623 that are connected between two ends of the two outer portions 2621, and the two outer portions 2621 are connected to outer surfaces of the two rotatable connecting members 261. Preferably, the first portion 2622 is parallel to the second portion 2623. Preferably, the two rotatable connecting members 261 are rotatably mounted in the two connecting portions 22A, respectively. The connecting structure 260 further includes a driving member 263 (for example, a driving motor), and the driving member 263 is coupled to the corresponding connecting member 261 to drive the connecting member 261 to rotate relative to the connecting portion 22A. The connecting structure 260 further includes at least one limiting roller set 231. The connecting structure 260 further includes a first limiting roller set 2311 disposed at the bendable portion 22 and a second limiting roller set 2312 disposed at the two connecting portions 22A. Preferably, the second limiting roller set 2312 is disposed in the auxiliary ribs 23. The entire frame 20 is connected by the elastic belt 262, and the elastic belt 262 is moved by the rotation of the two rotatable connecting members 261 and the limiting roller 231 to adapt to the dynamic bending/dynamic expending effect. For example, when the two rotatable connecting members 261 that are disposed in the limiting frame 24 are rotated, a traction force is applied to the elastic belt 262 that forces the elastic belt 262 to tighten, thereby causing the entire frame to be bent inward, causing two end of the display panel, which is disposed on the frame, bent towards each other, thereby folding the display panel on the frame.

Figure 3A:
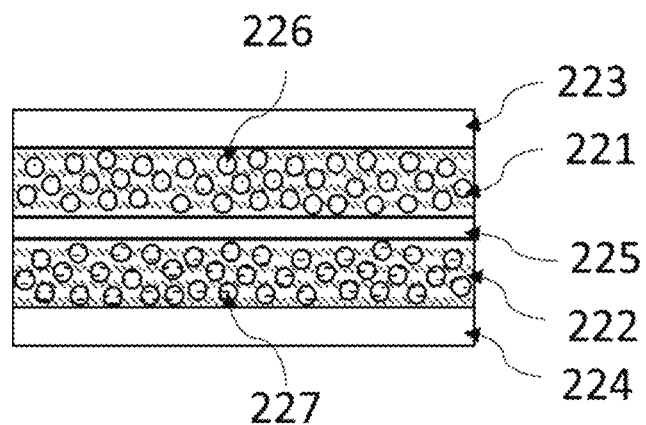
FIG. 3A is a schematic view of a bendable portion of the frame in FIG. 3.

Please refer to FIG. 3A, FIG. 3A is an embodiment of the present invention, which discloses that the bendable portion 22 of the frame of FIG. 3 is multi-layered polymer layer. In this embodiment, the bendable portion 22 has a first polymer layer 221 and a second polymer layer 222. The first polymer layer 221 and the second polymer layer 222 may be made of a polymer material having a higher strength, for example, amorphous polystyrene and the like. The first polymer layer 221 is located at the first side 222 of the bendable portion 22, and the first polymer layer 221 is added with a plurality of first elastic particles 226; and the second polymer layer 222 is located at the second side 223 of the bendable portion 22, the second polymer layer 222 is added with a plurality of second elastic particles 227. The first polymer layer 221 is amorphous high-density polyethylene, and the second polymer layer 222 is polyethylene or ethylene-vinyl acetate copolymer. The plurality of elastic particles 226 are high-compressibility elastic particles (for example, amorphous high-density polyethylene), and the plurality of second elastic particles 227 are high-tensility modulus polymer materials (for example, polyethylene or ethylene-vinyl acetate copolymer). A first protective layer 223 may be disposed on a surface of the first polymer layer 221, a second protective layer 224 is further disposed on a surface of the second polymer layer 222, and the first polymer layer 221 and the second polymer layer 222 may further be provided with a connection layer 225 to be connected to each other.

Figure 3B:
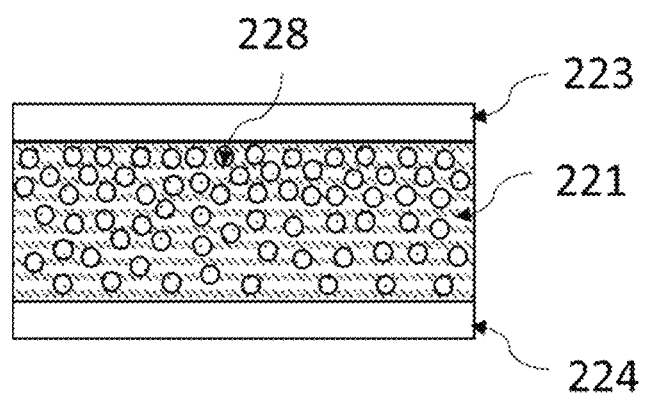
FIG. 3B is a schematic view of the bendable portion of the frame in FIG. 3.

FIG. 3B is another embodiment of the present invention, which discloses that the bendable portion 22 of the frame of FIG. 3 is a single-layer polymer layer. In this embodiment, the single-layer polymer layer 221 of the bendable portion 22 has a plurality of compressible particles 228, and the plurality of compressible particles 228 are high compressibility elastic particles (for example, amorphous high-density polyethylene). The single-layer polymer layer 221 made of a tensile polymer material in which the plurality of the compressible particles 228 distributed close to the first side 222 of the bendable portion 22 are more than the second side 223 of the bendable portion 22. An upper surface of the single-layer polymer layer 221 may further be provided with a first protective layer 223 and a lower surface of the single-layer polymer layer 221 may further be provided with a second protective layer 224.

Another embodiment of the present invention provides A frame, including: a substrate including a bendable portion and two connecting portions connected to two sides of the bendable portion; and a connecting structure including two connecting members and an elastic belt, wherein the two connecting members are respectively mounted to the two connecting portions and disposed opposite to each other, and the elastic belt is sleeved on the two connecting members and wound around outer surfaces of the two connecting members. Optionally, the elastic belt further includes two outer portions, and a first portion and a second portion that are connected between two ends of the two outer portions, and the two outer portions are connected to outer surfaces of the two connecting members. Optionally, the first portion is parallel to the second portion. Optionally, the two connecting members are respectively rotatably mounted to the two connecting portions. Optionally, the connecting structure further includes a driving member coupled to the corresponding connecting member to drive the connecting member to rotate relative to the connecting portion. Optionally, the connecting structure further includes at least one limiting roller set. Optionally, the connecting structure further includes a first limiting roller set disposed at the bendable portion and a second limiting roller set disposed at the two connecting portions; and the substrate further includes a plurality of auxiliary ribs, wherein the second limiting roller set is disposed in the auxiliary ribs. Optionally, a compressive property of a first side of the bendable portion that is close to an upper surface of the substrate is higher than a compressive property of a second side of the bendable portion that is away from the upper surface of the substrate, and a tensility of the second side of the bendable portion is higher than a tensility of the first side of the bendable portion. Optionally, the bendable portion has a first polymer layer and a second polymer layer; the first polymer layer is located at the first side of the bendable portion, and the second polymer layer is located at the second side of the bendable portion, and the first polymer layer is amorphous high-density polyethylene, and the second polymer layer is polyethylene or ethylene-vinyl acetate copolymer.

Compared with the conventional art, the frame 20 of the display 1 according to the present invention can not only simplify the structural design of the product, but also adapt the frame 20 of the display 1 to the deformation caused by the dynamic bending/dynamic expending of the display panel, and ensure that bending over a long period of time will not cause product failure. The present invention can also increase the tenacity of the flexible substrate, and facilitates to ensure the product reliability of the display panels under long time bending.

It is understood that the specific features of the present invention are described by separate embodiments for clarity, and may be provided in a combination of a single embodiment. Conversely, in the present invention, for the sake of brevity, various features described in the context of a single embodiment can also be implemented separately, or in any suitable sub-combination, or in any other described embodiment suitable for use in the present invention. The specific features described in the context of the various embodiments are not considered to be essential features of those embodiments unless the embodiments do not function without those elements.

Although the present invention has been described in conjunction with specific embodiments thereof, it will be appreciated that many alternatives, modifications, and variations will be apparent to those skilled in the art. Accordingly, it is intended to cover all alternatives, modifications and variations falling within the scope of the appended claims.

All publications, patents and patent applications mentioned in this specification are hereby incorporated by reference herein. The extent is as specifically and individually indicated as individual publications, patents or patent applications, which are incorporated herein by reference. Further, the cited or. indicated any reference is not to be construed as an admission that such reference is available as prior art to the present invention. The headings in this application are used herein to make the description easy to understand and should not be construed as limiting.

The invention claimed is:

1. A display, comprising:
   a display panel; and
   a frame, wherein the display panel is disposed on the frame, and the frame comprising:
   a substrate comprising a bendable portion and two connecting portions connected to two sides of the bendable portion, wherein the bendable portion is designed to allow the frame to bend the substrate and the display panel; and
   a connecting structure comprising two rotatable connecting members and an elastic belt, wherein the two rotatable connecting members are respectively mounted to the two connecting portions and disposed opposite to each other, and the elastic belt is on designed to pull and rotate the two rotatable connecting members and wound around outer surfaces of the two rotatable connecting members, wherein when the elastic belt is forced to tighten, the entire frame is bent inward, thereby folding the display panel on the frame,
   wherein the elastic belt further comprises two outer portions, and a first portion and a second portion are connected between one end and an end of the two outer portions, the two outer portions are connected to outer surfaces of the two rotatable connecting members, and the first portion is parallel to the second portion.

2. The display according to claim 1, wherein the two rotatable connecting members are respectively rotatably mounted to the two connecting portions, and wherein the connecting structure further comprises a driving member coupled to the corresponding connecting member to drive the connecting member to rotate relative to the connecting portion.

3. The display according to claim 2, wherein the connecting structure further comprises a first limiting roller set disposed at the bendable portion and a second limiting roller set disposed at the two connecting portions; and the substrate further comprises a plurality of auxiliary ribs, wherein the second limiting roller set is disposed in the auxiliary ribs.

4. The display according to claim 1, wherein the connecting structure further comprises at least one limiting roller set.

5. The display according to claim 1, wherein a compressive property of a first side of the bendable portion that is close to an upper surface of the substrate is higher than a compressive property of a second side of the bendable portion that is away from the upper surface of the substrate, and a tensility of the second side of the bendable portion is higher than a tensility of the first side of the bendable portion.

6. The display according to claim 5, wherein the bendable portion has a first polymer layer and a second polymer layer; the first polymer layer is located at the first side of the bendable portion, and the second polymer layer is located at the second side of the bendable portion, and the first polymer layer is amorphous high-density polyethylene, and the second polymer layer is polyethylene or ethylene-vinyl acetate copolymer.

* * * * *